(12) United States Patent
Jang et al.

(10) Patent No.: US 9,657,225 B2
(45) Date of Patent: May 23, 2017

(54) MULTICOLOR TUNABLE NANOPHOSPHOR AND ITS SYNTHESIS METHOD AND TRANSPARENT POLYMER COMPOSITE INCLUDING THE NANOPHOSPHOR

(71) Applicant: KOREA INSTITUTE OF SCIENCE AND TECHNOLOGY, Seoul (KR)

(72) Inventors: Ho Seong Jang, Seoul (KR); Su Yeon Kim, Seoul (KR); Sun Jin Kim, Seoul (KR); So-Hye Cho, Seoul (KR); Seung Yong Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 92 days.

(21) Appl. No.: 14/639,385

(22) Filed: Mar. 5, 2015

(65) Prior Publication Data
US 2016/0108312 A1 Apr. 21, 2016

(30) Foreign Application Priority Data

Oct. 20, 2014 (KR) ........................ 10-2014-0142046

(51) Int. Cl.
| | | |
|---|---|---|
| C09K 11/77 | (2006.01) | |
| C09K 11/02 | (2006.01) | |
| G01N 21/64 | (2006.01) | |
| H01L 31/0232 | (2014.01) | |
| B82Y 20/00 | (2011.01) | |
| B82Y 40/00 | (2011.01) | |

(52) U.S. Cl.
CPC ........ *C09K 11/7791* (2013.01); *C09K 11/025* (2013.01); *C09K 11/7773* (2013.01); *H01L 31/02322* (2013.01); *B82Y 20/00* (2013.01); *B82Y 40/00* (2013.01); *Y10S 977/773* (2013.01); *Y10S 977/779* (2013.01); *Y10S 977/95* (2013.01)

(58) Field of Classification Search
CPC ... C09K 11/02; C09K 11/772; C09K 11/7773; C09K 11/7791; Y10S 977/783; Y10S 977/775; Y10S 977/779; Y10S 977/834; Y10Y 428/2991; H01L 31/055
See application file for complete search history.

(56) References Cited

U.S. PATENT DOCUMENTS

| | | | |
|---|---|---|---|
| 7,699,456 B2 * | 4/2010 | Haubold | ............. B41J 2/01 347/100 |
| 2011/0127445 A1 | 6/2011 | Zhang et al. | |

FOREIGN PATENT DOCUMENTS

KR    10-2013-0050545 A    5/2013

OTHER PUBLICATIONS

Kim et al, "A strategy to enhance Eu3+ emission from LiYF4:Eu nanophosphors and green-to-organge multicolor tunale, transparent nanophosphor-polymer composites", Nature.com/Scienific Reports, 5:7866, Jan. 19, 2015, pp. 1-11.*
J. A. Capobianco et al., Sensitized Ce3+ and Gd3+ Ultraviolet Emissions by Tm3+ in Colloidal LiYF4 Nanocrystals, Chemistry a European Journal, Jul. 27, 2009, pp. 9660-9663, vol. 15.
Li Fu et al. Cooperative Down-Conversion Luminescence in Tb3+/Yb3+ Co-Doped LiYF4 Single Crystals, IEEE Photonics Journal. Feb. 2014, pp. 1-10, vol. 6. No. 1.
Wang et al.,Lanthanide-doped LiYF4 nanoparticles: Synthesis and multicolor upconversion tuning, Comptes Rendus Chimie, May 7, 2010, pp. 731-736, vol. 13.

* cited by examiner

*Primary Examiner* — Carol M Koslow
(74) *Attorney, Agent, or Firm* — Goldilocks Zone IP Law

(57) ABSTRACT

The present invention relates to a nanophosphor which may be used as a wavelength conversion part of a solar cell, a fluorescent contrast agent, and a light emitting part of a display device, and a synthesis method thereof. The nanophosphor of the present invention is excited by ultraviolet light to exhibit strong green light emission, and has multicolor light emission characteristics capable of controlling a color such as green, yellowish green, yellow, and orange color by only adjusting the amount of a doping agent.

11 Claims, 6 Drawing Sheets
(6 of 6 Drawing Sheet(s) Filed in Color)

MULTICOLOR TUNABLE NANOPHOSPHOR AND ITS SYNTHESIS METHOD AND TRANSPARENT POLYMER COMPOSITE INCLUDING THE NANOPHOSPHOR

CROSS-REFERENCE TO RELATED APPLICATION

Pursuant to 35 U.S.C. §119(a), this application claims the benefit of earlier filing date and right of priority to Korean Application No. 10-2014-0142046, filed on Oct. 20, 2014, the contents of which are incorporated by reference herein in its entirety.

BACKGROUND OF THE INVENTION

1. Field of the Invention

The present invention relates to a nanophosphor which may be used as a wavelength conversion part of a solar cell, a fluorescent contrast agent, and a light emitting part of a display device, and a synthesis method thereof, and particularly, to the synthesis of a fluoride-based nanophosphor having a particle size of 2 nm to 60 nm and a tetragonal structure, which is excited by ultraviolet light to emit strong green light and emits visible light that can be controlled over the colors such as green, yellowish green, yellow, and orange colors only by adjusting the amount of a doping agent.

2. Background of the Invention

Nanophosphors have a structure in which a lanthanide element is doped into an oxide, fluoride, sulfide or nitride-based host material with a size of 100 nm or less. A nanophosphor doped with trivalent lanthanide ions except for $Ce^{3+}$ ion exhibits an inherent luminescent color depending on the doped lanthanide element, regardless of a type of host material. This is because the light emission of the nanophosphor is generated by 4f-4f transition due to the transition of 4f electrons of the trivalent lanthanide ions to dope the host material. Therefore, there is an advantage in that a desired light emission wavelength may be maintained even though sizes of particles are differently adjusted, if necessary.

Since these nanophosphors, even though being doped with the same lanthanide element, show characteristics which are different in intensity of light emission according to the type of host material to be doped, an appropriate host material needs to be selected in order to obtain strong light emission.

Further, since these nanophosphors exhibit fixed light emission colors, such as red or green, according to the element to be doped, there is a disadvantage in that it is difficult to obtain a desired light emission color, except for several fixed colors. To overcome this problem, when two or more types of phosphors, which exhibit different light emission colors, are mixed, various colors may be implemented, but there is a disadvantage in that excitation light sources with different wavelengths need to be used. This is because each element has an inherent absorption wavelength range in the case of light emission via 4f-4f transition, and accordingly, the mixed phosphors do not all emit light under a single excitation wavelength. To solve this problem, Wang, et al., (Nanotechnology vol, 18. 025701 (2007)), could obtain light emission of green, red and bluish green colors, and the like using a single wavelength around 250 nm by emitting light through a process of coating Ce on $NaGdF_4$ particles doped with each of Tb, Eu, Sm and Dy to absorb ultraviolet light around 250 nm and transferring the absorbed in energy to each lanthanide element. However, this case, only a green light emission may be obtained when Ce and Tb are co-doped, only a red light emission may be obtained when Ce and Eu are co-doped, only the red light emission may also be obtained when Ce and Sm are co-doped, and a bluish green light emission may be obtained when Ce and Dy are co-doped. That is, only an inherent light emission color emitted by each of Tb, Eu, Sm and Dy could be implemented. Further, the amount of the co-doping agent Ce is so low that the absorption efficiency of excitation light is low and accordingly, there is a disadvantage in that it is difficult to obtain strong light emission. In addition, when various light emission colors are implemented through energy transfer, the larger the amount of doping agent to which energy is transferred is, the weaker the light emission of the doping agent which transfers energy becomes, and accordingly, the stronger light emission of the doping agent which transfers energy is, the more advantageous it is.

For light emission of a nanophosphor, nanophosphor particles, which use light in an infrared wavelength range as excitation light, have been known in the related art. However, in this case, light emission occurs in an upconversion mechanism in which an infrared light with a wavelength of about 980 nm is converted into visible light, and thus the intensity of a light source must be strong. Accordingly, it is impossible to observe light emission using a common lamp, but laser needs to be used as a light source. Furthermore, it has been reported that upconversion nanophosphors generally have an efficiency less than 1%, whereas downconversion nanophosphors have an efficiency of 30 to 40% to 70% in some cases.

In addition, since a single-junction amorphous silicon solar cell has a very low efficiency when irradiated with light in an ultraviolet range, and a high efficiency when irradiated with light in a visible light range of 500 nm or more, the efficiency may be enhanced by a method of disposing a wavelength conversion material which may convert ultraviolet light into a visible light range on the front surface portion of a silicon solar cell. At this time, when the size of a wavelength conversion material disposed on the front surface portion of the solar cell, that is, the size of a phosphor is large, incident light is scattered, thereby leading to deterioration in efficiency of the solar cell. Therefore, a nanophosphor having a small phosphor needs to be used in order to minimize the scattering of incident light. In general, since light emission from the nanophosphor is weaker than that from a microphosphor powder, a nanophosphor having a very strong light emission should be applied in order to enhance the efficiency of the solar cell using a wavelength conversion from ultraviolet light to visible light.

Furthermore, when light emission of individual nanophosphors as in a bioimaging contrast agent is used, various types of nanophosphors may not be mixed and used in some cases. In general, organic dyes have been widely used as bioimaging contrast agents. The organic dyes have characteristics of exhibiting various light emission colors and showing high light emission intensity according to types. However, due to extremely low photostability, there is a disadvantage in that a slight increase in an exposure time to excitation light may lower light emission intensity drastically. To overcome the problem, attempts have been recently made to apply inorganic light emission materials, such as quantum dots as bioimaging contrast agents, but the quantum dots cause blinking of light emission, and are difficult to be applied when containing a heavy metal, such as Cd, as in the case of CdSe.

Therefore, there is urgent need for developing a new material which facilitates tuning of a light emission color, and exhibits high stability without blinking of light emission. When a nanophosphor which may emit light in various wavelength bands under one excitation wavelength is implemented, the nanophosphor may be applied as a bio imaging contrast agent capable of differentiating various materials, and also a display device with ultrahigh image quality capable of emitting light with various colors may be implemented.

Throughout the present specification, a plurality of papers and patent documents are referenced, and citations thereof are indicated. The disclosure of each of the cited papers and patent documents is incorporated herein by reference in its entirety to describe the level of the technical field to which the present invention pertains and the content of the present invention more apparently.

CITATION LIST

Patent Document (Patent Document 1) US Patent Publication No. 2011-0127445

SUMMARY OF THE INVENTION

The present invention has been made in an effort to solve the problem in the related art as described above and has an object to provide a nanophosphor which may implement a strong green light emission by doping a $LiYF_4$ fluoride-based host material with Ce and Tb, and may implement various light emission colors by only varying the composition ratio of a doping agent under a single excitation wavelength using Eu as a co-doping agent.

The other objects and advantages of the present invention will be more apparent from the following detailed description, claims and drawings of the invention.

An aspect of the present invention is to provide a fluoride-based nanoparticle co-doped with $Ce^{3+}$ and $Tb^{3+}$, which is represented by the following Formula 1.

$$LiY_{1-x-y}F_4:Ce^{3+}{}_x, Tb^{3+}{}_y \quad \text{[Formula 1]}$$

In Formula 1, x is a real number in the range of $0.01 \leq x \leq 0.2$, and y is a real number in the range of $0.01 \leq y \leq 0.3$.

In the nanophosphor, a co-doping agent $Ce^{3+}$ may absorb ultraviolet light, and transfer the absorbed energy to $Tb^{3+}$, thereby obtaining strong light emission in a green spectrum region.

A nanophosphor according to an exemplary embodiment of the present invention includes a fluoride-based nanoparticle co-doped with $Ce^{3+}$, $Tb^{3+}$, and $Eu^{3+}$, which is represented by the following Formula 2.

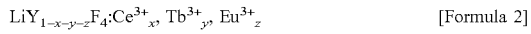
$$LiY_{1-x-y-z}F_4:Ce^{3+}{}_x, Tb^{3+}{}_y, Eu^{3+}{}_z \quad \text{[Formula 2]}$$

In Formula 2, x is a real number in the range of $0.1 \leq x \leq 0.15$, and y is a real number in the range of $0 \leq y \leq 0.2$, and z is a real number in the range of $0 \leq z \leq 0.1$.

In the nanophosphor, the co-doping agent $Ce^{3+}$ absorbs ultraviolet light and transfers the absorbed energy to $Tb^{3+}$ and $Eu^{3+}$, so that light emission peaks appear in the green and red regions, and a desired light emission color may be obtained by adjusting the relative amount of $Tb^{3+}$ and $Eu^{3+}$ to adjust the relative ratio of light emission intensity in the green and red regions.

The nanophosphor may include a core including the nanoparticle and a shell disposed on the surface of the core, and the shell may be composed of a compound represented by the following Formula 3.

$$LiY_{1-r}M_rF_4 \quad \text{[Formula 3]}$$

In Formula 3, r is a real number in the range of $0 \leq r \leq 1$, and M is one selected from the group consisting of lanthanide elements and a combination thereof.

The lanthanide element may be one selected from the group consisting of La, Ce, Pr, Nd, Pm, Sm, Eu, Gd, Tb, Dy, Ho, Er, Tm, Yb, and Lu.

The nanoparticle may have a size of 2 nm to 60 nm.

The nanoparticle may have a tetragonal structure.

The nanoparticle may have downconversion characteristics capable of adjusting the color coordinate.

The nanoparticle may have characteristics of absorbing ultraviolet light with a single wavelength to emit light.

Another aspect of the present invention provides a method for preparing a fluoride-based $LiYF_4$ nanoparticle co-doped with Ce and Tb, or Ce, Tb and Eu, which is represented by Formula 1 or 2, the method including: (i) a complex compound forming step of forming a lanthanide complex compound by heating a first mixed solution including an yttrium compound, a cerium compound, and a terbium compound; or an yttrium compound, cerium compound, a terbium compound, and a europium compound, (ii) a reaction solution preparing step of preparing a reaction solution by mixing a second mixed solution including a lithium compound and a fluorine compound with the formed lanthanide complex compound, and (iii) a nanoparticle forming step of forming a nanoparticle by subjecting the reaction solution to heat treatment.

The yttrium precursor may be one selected from the group consisting of yttrium acetate ($Y(CH_3COO)_3$), yttrium chloride ($YCl_3$), yttrium chloride hydrate ($YCl_3 \cdot 7H_2O$), and a combination thereof.

The cerium precursor may be one selected from the group consisting of cerium acetate ($Ce(CH_3COO)_3$), cerium chloride ($CeCl_3$), cerium chloride hydrate ($CeCl_3 \cdot 7H_2O$), and a combination thereof.

The terbium precursor may be one selected from the group consisting of terbium acetate ($Tb(CH_3COO)_3$), terbium chloride ($TbCl_3$), terbium chloride hydrate ($TbCl_3 \cdot 6H_2O$), and a combination thereof.

The europium precurr may be one selected from the group consisting of europium acetate ($Eu(CH_3COO)_3$), europium chloride ($EuCl_3$), europium chloride hydrate ($EuCl_3 \cdot 6H_2O$), and a combination thereof.

In an exemplary embodiment, the first mixed solution in step (i) may further include sodium oleate, water, ethanol, and hexane along with yttrium, cerium, and terbium compounds; or yttrium, cerium, terbium, and europium compounds.

In another exemplary embodiment, the second mixed solution in step (ii) may further include alcohol. In this case, step (iii) may be performed by removing alcohol from a reaction solution, and subjecting the reaction solution from which alcohol is removed to heat treatment.

The heat treatment performed in the nanoparticle forming step may be performed at 200 to 370° C. for 20 minutes to 4 hours.

The method may further include a shell forming step after the nanoparticle forming step.

The shell forming step includes: a step of preparing a third mixed solution including an yttrium compound, a step of preparing a fourth mixed solution by mixing the nanoparticle formed in the nanoparticle forming step (iii) with the third mixed solution, a shell reaction solution preparing step of preparing a shell reaction solution by mixing a lithium compound and a fluorine compound with the fourth mixed solution, and a shell forming step of forming a shell on the surface of the nanoparticle by subjecting the shell reaction solution to heat treatment.

In an exemplary embodiment, the third mixed solution may further include oleic acid and 1-octadecene along with a lanthanide precursor including a yttrium precursor.

In another exemplary embodiment, the shell reaction solution may further include alcohol, and in this case, the shell forming step may be performed by removing alcohol from a shell reaction solution and subjecting the shell reaction solution to heat treatment.

The yttrium precursor may be one selected from the group consisting of yttrium acetate ($Y(CH_3COO)_3$), yttrium chloride ($YCl_3$), yttrium chloride hydrate ($YCl_3.6H_2O$), and a combination thereof.

Still another aspect of the present invention provides a method for obtaining light emission characteristics of a fluoride-based $LiYF_4$ nanophosphor, the method including: a step of preparing a fluoride-based multicolor light emission $LiYF_4$ nanophosphor co-doped with $Ce^{3+}$ and $Tb^{3+}$, or $Ce^{3+}$, $Tb^{3+}$ and $Eu^{3+}$, which is represented by any one of Formula 1 to 3; and a step of applying ultraviolet light with a single wavelength as an excitation light source to the nanophosphor. As the excitation light source, an ultraviolet light lamp may also be used.

In the case of performing upconversion light emission in which infrared light is converted into visible light, the intensity of a light source needs to be strong, so that a common laser needs to be used as an excitation light source, and it is difficult to observe light emission by a general lamp. In contrast, since the nanophosphor according to the present invention follows the downconversion mechanism in which Ce absorbs ultraviolet light and Tb and Eu emit green and red peaks, the efficiency is so high that light emission is observed by a portable ultraviolet light lamp or natural solar light.

Yet another aspect of the present invention provides various products including a fluoride-based multicolor light emitting $LiYF_4$ nanophosphor co-doped with $Ce^{3+}$ and $Tb^{3+}$, or $Ce^{3+}$, $Tb^{3+}$ and $Eu^{3+}$, which is represented by any one of Formulae 1 to 3.

According to still another exemplary embodiment of the present invention, the product may be a polymer composite including the nanophosphor of the present invention, a solar cell including the nanophosphor of the present invention as a wavelength conversion layer, or a forgery prevention code including the nanophosphor of the present invention as a wavelength conversion layer.

Hereinafter, the present invention will be described in more detail.

A nanophosphor according to an exemplary embodiment of the present invention includes a fluoride-based nanoparticle co-doped with $Ce^{3+}$ and $Tb^{3+}$, which is represented by the following Formula 1.

$$LiY_{1-x-y}F_4:Ce^{3+}{}_x, Tb^{3+}{}_y \quad \text{[Formula 1]}$$

In Formula 1, x is a real number in the range of $0.01 \le x \le 0.2$, and y is a real number in the range of $0.01 \le y \le 0.3$.

The nanoparticle may have a size of 2 nm to 60 nm.
The nanoparticle may have a tetragonal structure.

The nanophosphor may be composed of a compound which further includes $Eu^{3+}$ in addition to $Ce^{3+}$ and $Tb^{3+}$ and is represented by the following Formula 2.

$$LiY_{1-x-y-z}F_4:Ce^{3+}{}_x, Tb^{3+}{}_x, Tb^{3+}{}_y, Eu^{3+}{}_z \quad \text{[Formula 2]}$$

In Formula 2, x is a real number in the range of $0.1 \le x \le 0.15$, and y is a real number in the range of $0 \le y \le 0.2$, and z is a real number in the range of $0 \le z \le 0.1$.

The nanophosphor may include a core including the nanoparticle and a shell disposed on the surface of the core, and the shell may be composed of a compound represented by the following Formula 3.

$$LiY_{1-r}M_rF_4 \quad \text{[Formula 3]}$$

In Formula 3, r is a real number in the range of $0 \le r \le 1$, and M is one selected from the group consisting of yttrium (Y), lanthanide elements and a combination thereof.

The lanthanide element may be one selected from the group consisting of La, Ce, Pr, Nd, Pm, Sm, Eu, Gd, Tb, Dy, Ho, Er, Tm, Yb, and Lu.

The shell may be crystalline, and may be formed through epitaxial growth.

When the shell is epitaxially grown as a crystalline shell, nanoparticle surface defects may be reduced, thereby obtaining excellent light emission characteristics.

The nanoparticle may have a size of 70 nm or less, and a size of more than 2 nm and 70 nm or less.

The nanophosphor includes the core represented by Formulae 1 and 2 and the shell represented by Formula 3, and thus may implement a strong light emission intensity even though the nanophosphor has a small size of 100 nm or less.

The method for preparing a nanophosphor according to another exemplary embodiment of the present invention include a complex compound forming step, a mixed solution forming step, a reaction solution preparing step, and a nanoparticle forming step, in which the nanoparticle is a fluoride-based nanoparticle co-doped with $Ce^{3+}$ and $Tb^{3+}$, which is represented by the following Formulae 1 and 2.

$$LiY_{1-x-y}F_4:Ce^{3+}{}_x, Tb^{3+}{}_y \quad \text{[Formula 1]}$$

$$LiY_{1-x-y-z}F_4:Ce^{3+}{}_x, Tb^{3+}{}_y, Eu^{3+}{}_z \quad \text{[Formula 2]}$$

Since the specific explanation for Formulae 1 and 2 is identical to that for the nanophosphor, the description thereof will be omitted.

The complex compound forming step includes a process of forming a lanthanide complex compound by heating a mixed solution of an yttrium precursor, a cerium precursor, a terbium precursor, sodium oleate, water, ethanol and hexane in the case of Formula 1. In the case of Formula 2, the complex compound forming step additionally includes a europium precursor.

The heating may be performed at 40 to 90° C., and may be performed at 60 to 80° C. When the heating is performed in the temperature range, a lanthanide oleate complex compound may be formed.

The mixed solution forming step may include a process of mixing the lanthanide complex compound with oleic acid and 1-octadecene. The mixed solution forming step includes a process of forming a solution including a lanthanide complex compound by heating the mixed solution. The heating may be performed at 100 to 200° C., and may be performed at 130 to 180° C. When the heating is performed in the temperature range, it is possible to form a mixed solution in which a lanthanide complex compound is uniformly dispersed.

The reaction solution preparing step includes a process of preparing a reaction solution by mixing a second mixed solution including a lithium precursor, a fluorine precursor and alcohol with the mixed solution.

The lithium precursor may be one selected from the group consisting of lithium hydroxide, lithium fluoride, lithium chloride and a combination thereof.

The lithium precursor may be one selected from the group consisting of ammonium fluoride, lithium fluoride and a combination thereof.

The aforementioned lithium fluoride may serve as both the lithium precursor and the fluorine precursor.

The nanoparticle forming step includes a process of forming a nanoparticle by removing alcohol from the reaction solution, and subjecting the reaction solution from which alcohol is removed to heat treatment.

The heat treatment may be performed at 200 to 370° C. under an inert gas atmosphere for 20 minutes to 4 hours, and may be performed at 250 to 330° C. for 50 minutes to 3 hours.

When the heat treatment is performed in the temperature and time ranges, a tetragonal nano crystal particle having high crystallinity may be formed, thereby showing excellent light emission characteristics.

When the heat treatment temperature is less than 200° C., it is difficult for a single tetragonal nano crystal to be completely formed, and the light emission intensity may be weak.

When the heat treatment temperature is higher than 370° C., aggregation of particles may occur, the nanoparticles may not be uniformly dispersed, and brightness of the nanoparticle may deteriorate.

The nanoparticle may be stored while being dispersed in a non-polar solvent, and the non-polar solvent may be one selected from the group consisting of hexane, toluene, chloroform and a combination thereof, but is not limited thereto.

The method for preparing a nanophosphor may further include a shell forming step after the nanoparticle forming step.

The shell forming step includes a shell preparing step, a nanoparticle mixing step, a shell reaction solution preparing step, and a shell forming step.

The shell preparing step includes a process of preparing a third mixed solution including a lanthanide precursor including a yttrium precursor, oleic acid, and 1-octadecene. The yttrium precursor may be one selected from the group consisting of yttrium acetate ($Y(CH_3COO)_3$), yttrium chloride ($YCl_3$), yttrium chloride hydrate ($YCl_3.6H_2O$), and a combination thereof.

The nanoparticle mixing step includes a process of preparing a fourth mixed solution by mixing the nanoparticle formed in the nanoparticle forming step with the third mixed solution.

The nanoparticle formed in the nanoparticle forming step may be the nanoparticle formed in the nanoparticle forming step or a nanoparticle subjected to a cooling step or a washing step.

The shell reaction solution preparing step includes a process of preparing a shell reaction solution by mixing a solution including a lithium precursor, a fluorine precursor and alcohol with the fourth mixed solution.

The lithium precursor may be one selected from the group consisting of lithium hydroxide, lithium fluoride, lithium chloride and a combination thereof.

The lithium precursor may be one selected from the group consisting of ammonium fluoride, lithium fluoride and a combination thereof.

The aforementioned lithium fluoride may serve as both the lithium precursor and the fluorine precursor.

The shell forming step includes a process of forming a shell on the surface of a core including the nanoparticle by removing alcohol from the shell reaction solution, and subjecting the shell reaction solution from which alcohol is removed to heat treatment.

The heat treatment may be performed at 200 to 370° C. under an inert gas atmosphere for 20 minutes to 4 hours, and may be performed at 250 to 330° C. for 50 minutes to 3 hours.

When the heat treatment is performed in the temperature and time ranges, a tetragonal nano crystal shell may be epitaxially formed, and it is possible to show light emission characteristics better than those of the core nanophosphor.

When the heat treatment temperature is less than 200° C., it is difficult for a single tetragonal crystalline shell to be completely formed, and when the temperature is higher than 370° C., the shell precursor forms not only a shell, but also core, so that a shell may not be effectively formed.

The nanophosphor of the present invention exhibits green light emission stronger than that of $NaYF_4$:Ce,Tb by using $LiYF_4$ as a host material and co-doping $Ce^{3+}$ and $Tb^{3+}$, and allows various light emission colors to be exhibited by doping the $LiYF_4$ host material with lanthanide element capable to emit both green and red light, and doping the host material with a co-doping agent which may effectively absorb excitation energy and transfer the excitation energy to a doping agent.

As described in detail above, according to the present invention, the nanophosphor is excited by ultraviolet light with a single wavelength to exhibit strong green light emission, an inorganic nanophosphor, which emits light with various colors such as green, yellow and orange color, is obtained, and light emission by electron transition of a lanthanide element is used. Accordingly, there is an advantage in that no blinking occurs and photostability is excellent. Therefore, the nanophosphor may be applied as a bioimaging contrast agent which may detect various materials, and may also be utilized as a transparent display device. Further, the nanophosphor has a high efficiency of converting ultraviolet into green, and thus is expected to enhance the efficiency of a single-junction amorphous Si solar cell when applied to a front surface portion of the solar cell, so that the nanophosphor is expected to be utilized in various fields.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are included to provide a further understanding of the invention and are incorporated in and constitute a part of this specification, illustrate exemplary embodiments and together with the description serve to explain the principles of the invention.

In the drawings:

FIG. 1 is PL light emission spectra of LiYF$_4$:Ce,Tb and NaYF$_4$:Ce,Tb nanophosphors according to preferred exemplary embodiments of the present invention.

FIG. 2 is a transmission electron microscopy image of a LiYF$_4$:Ce,Tb nanophosphor according to a preferred exemplary embodiment of the present invention.

FIG. 3 is an X-ray diffraction pattern of the LiYF$_4$:Ce,Tb nanophosphor according to a preferred exemplary embodiment of the present invention.

FIG. 4 is an X-ray diffraction patterns according to a variation in amount of Tb and Eu of LiYF$_4$:Ce,Tb,Eu nanophosphors according to a preferred exemplary embodiment of the present invention.

FIG. 5 is PL light emission spectra according to a change in amount of Tb and Eu of LiYF$_4$:Ce,Tb,Eu nanophosphors according to a preferred exemplary embodiment of the present invention.

FIG. 6 is color coordinates of a light emission color according to a change in amount of Tb and Eu of LiYF$_4$:Ce,Tb,Eu nanophosphors according to a preferred exemplary embodiment of the present invention.

FIG. 7 is a light emission photograph according to a change in amount of Tb and Eu of LiYF$_4$:Ce,Tb,Eu nanophosphor solutions according to a preferred exemplary embodiment of the present invention.

FIG. 8 is a transmission electron microscopy image of a LiYF$_4$:Ce,Tb/LiYF$_4$ core/shell nanophosphor according to a preferred exemplary embodiment of the present invention.

FIG. 9 is PL light emission spectra of a LiYF$_4$:Ce,Tb core and a LiYF$_4$:Ce,Tb/LiYF$_4$ core/shell nanophosphor according to a preferred exemplary embodiment of the present invention.

FIG. 10 is a photograph of a polymer composite in which a LiYF$_4$:Ce,Tb,Eu nanophosphor according to an exemplary embodiment of the present invention is dispersed in a PDMS polymer.

FIG. 11 is a photograph of a nanophosphor-polymer composite prepared in Example 10 of the present invention.

DETAILED DESCRIPTION OF THE INVENTION

Figure 1:
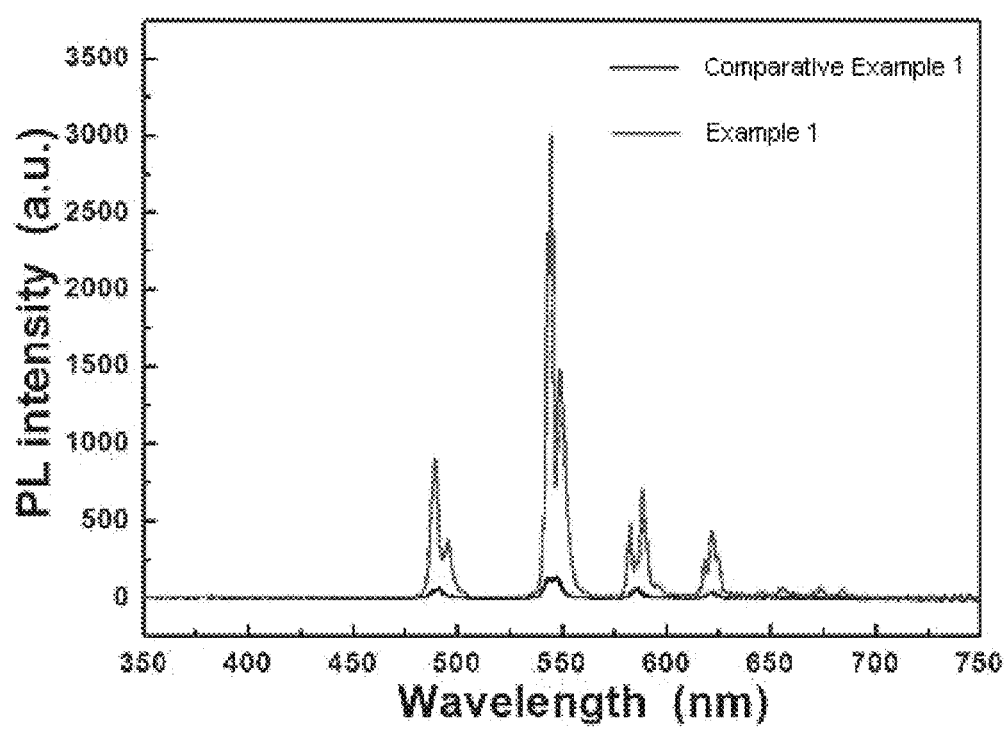

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, the present invention will be described in more detail through the Examples. These Examples are provided only for more specifically describing the present invention, and it will be obvious to a person with ordinary skill in the art to which the present invention pertains that the scope of the present invention is not limited by these Examples.

EXAMPLE

Example 1

Preparation of Fluoride Nanophosphor Doped with 0.15 mmol of Ce$^{3+}$ and 0.15 mmol of Tb$^{3+}$ 0.15 mmol of yttrium chloride hydrate (YCl$_3$.6H$_2$O), 0.15 mmol of cerium chloride hydrate (CeCl$_3$.7H$_2$O), 0.15 mmol of terbium chloride hydrate (TbCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a size of 1 to 60 nm in a colloidal state was obtained. The nanophosphor thus prepared was washed with acetone or ethanol, and then was stored while being dispersed in a non-polar solvent such as hexane, toluene, and chloroform.

Comparative Example 1

Fluoride Nanophosphor Doped with 0.1 mmol of Ce$^{3+}$ and 0.15 mmol of Tb$^{3+}$ 0.1 mmol of yttrium chloride hydrate (YCl$_3$.6H$_2$O), 0.1 mmol of cerium chloride hydrate (CeCl$_3$.7H$_2$O), 0.15 mmol of terbium chloride hydrate (TbCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single βn-phase nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

FIG. 1 illustrates light emission spectra of nanophosphors synthesized by the methods suggested in Example 1 and Comparative Example 1 according to the present invention. The light emission spectra were measured by using F-7000 model manufactured by Hitachi Ltd. In the case of comparing the maximum light emission intensity of the nanophosphor prepared according to Example 1 with that of the nanophosphor prepared according to Comparative Example 1, 25 times stronger green light emission was exhibited in the case where the nanophosphor of the present invention prepared according to Example 1 when excited by ultraviolet light was compared to the existing nanophosphor prepared according to Comparative Example 1.

Figure 2:
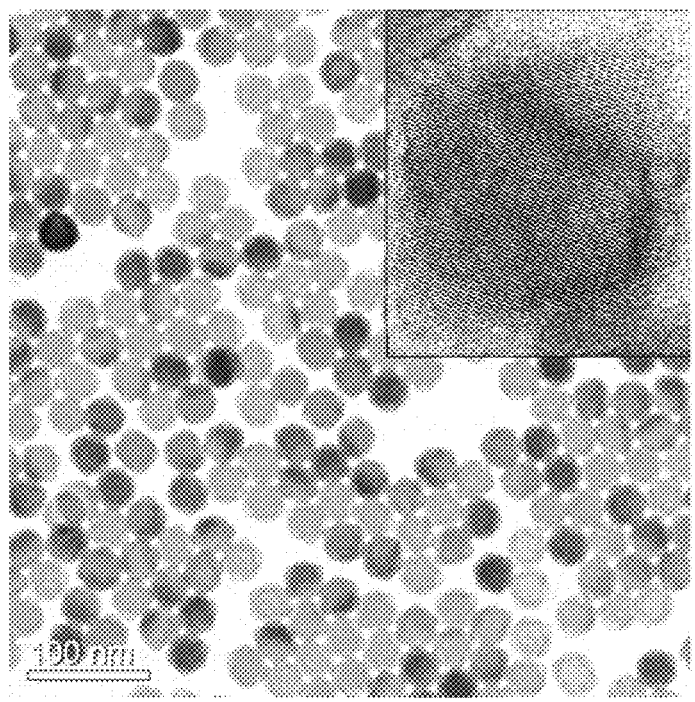

FIG. 2 is a transmission electron microscopy image of the nanophosphor synthesized in Example 1 according to the present invention. The transmission electron microscopy image illustrated in FIG. 2 was taken by using a TECNAI F20 G$^2$ model manufacture by FEI Co., Ltd. Nanophosphors synthesized through the present invention showed a size in a nano range of 60 nm or less. Referring to the high-resolution transmission electron microscopy image illustrated in FIG. 2, it can be confirmed that one nanophosphor particle has a clear lattice pattern, meaning that the synthesized nanophospohor had very high crystallinity. Since the crystallinity of the phosphor host material needs to be high in order to obtain strong light emission from the phosphor, it can be seen that it is possible to obtain a nanophosphor showing excellent light emission characteristics from high crystallinity of the nanophosphor according to the present invention.

Figure 3:
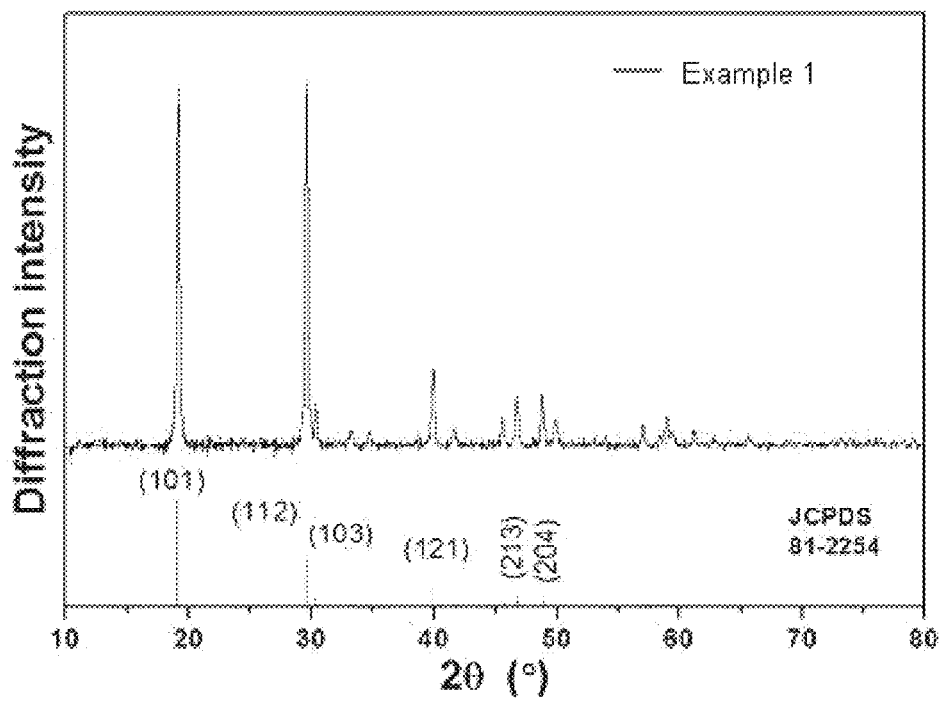

FIG. 3 illustrates an X-ray diffraction pattern of the nanophosphor synthesized in Example 1 according to the present invention. It can be confirmed that a single tetragonal phase was formed well from the measured diffraction pattern.

Example 2

LiYF$_4$ Nanophosphor Doped with 0.13 mmol of Ce$^{3+}$ and 0.14 mmol of Tb$^{3+}$ 0.73 mmol of yttrium chloride hydrate (YCl$_3$.6H$_2$O), 0.13 mmol of cerium chloride hydrate (CeCl$_3$.7H$_2$O), 0.14 mmol of terbium chloride hydrate (TbCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Example 3

LiYF$_4$ Nanophosphor Doped with 0.13 mmol of Ce$^{3+}$, 0.14 mmol of Tb$^{3+}$, and 0.01 mmol of Eu$^{3+}$ 0.72 mmol of yttrium chloride hydrate (YCl$_3$.6H$_2$O), 0.13 mmol of cerium chloride hydrate (CeCl$_3$.7H$_2$O), 0.14 mmol of terbium chloride hydrate (TbCl$_3$.6H$_2$O), 0.01 mmol of europium chloride hydrate (EuCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Example 4

LiYF$_4$ Nanophosphor Doped with 0.13 mmol of Ce$^{3+}$, 0.14 mmol of Tb$^{3+}$, and 0.02 mmol of Eu$^{3+}$ 0.71 mmol of yttrium chloride hydrate (YCl$_3$.7H$_2$O), 0.13 mmol of cerium chloride hydrate (CeCl$_3$.7H$_2$O), 0.14 mmol of terbium chloride hydrate (TbCl$_3$.6H$_2$O), 0.02 mmol of europium chloride hydrate (EuCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Example 5

LiYF$_4$ Nanophosphor Doped with 0.13 mmol of Ce$^{3+}$, 0.14 mmol of Tb$^{3+}$, and 0.03 mmol of Eu$^{3+}$ 0.70 mmol of yttrium chloride hydrate (YCl$_3$.6H$_2$O), 0.13 mmol of cerium chloride hydrate (CeCl$_3$.7H$_2$O), 0.14 mmol of terbium chloride hydrate (TbCl$_3$.6H$_2$O), 0.03 mmol of europium chloride hydrate (EuCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Example 6

LiYF$_4$ Nanophosphor Doped with 0.13 mmol of Ce$^{3+}$, 0.14 mmol of Tb$^{3+}$, and 0.04 mmol of Eu$^{3+}$ 0.69 mmol of yttrium chloride hydrate (YCl$_3$.6H$_2$O), 0.13 mmol of cerium chloride hydrate (CeCl$_3$.7H$_2$O), 0.14 mmol of terbium chloride hydrate (TbCl$_3$.6H$_2$O), 0.04 mmol of europium chloride hydrate (EuCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Example 7

LiYF$_4$ Nanophosphor Doped with 0.13 mmol of Ce$^{3+}$, 0.14 mmol of Tb$^{3+}$, and 0.05 mmol of Eu$^{3+}$ 0.68 mmol of yttrium chloride hydrate (YCl$_3$.6H$_2$O), 0.13 mmol of cerium chloride hydrate (CeCl$_3$.7H$_2$O), 0.14 mmol of terbium chloride hydrate (TbCl$_3$.6H$_2$O), 0.05 mmol of europium chloride hydrate (EuCl$_3$.6H$_2$O), and 3.1 mmol of sodium oleate (C$_{18}$H$_{33}$O$_2$Na) were weighed, a mixed solvent of a predetermined amount of water, ethanol, and hexane was added thereto, and heat treatment was performed at 70° C., thereby forming a lanthanide complex compound (a complex compound forming step). A mixed solution including a lanthanide complex compound was prepared by mixing the complex compound with a solution including oleic acid and 1-octadecene, and subjecting the resulting mixture to heat treatment at 140° C. for 30 minutes (a first mixed solution preparing step).

10 ml of a methanol solution including 2.5 mmol of lithium hydroxide and 4 mmol of ammonium fluoride was prepared (a second mixed solution preparing step), and then was mixed with a mixed solution including a lanthanide complex compound (a reaction solution preparing step).

The mixture was sufficiently mixed, methanol was removed from the mixture, and then heat treatment was performed under an inert gas atmosphere. At this time, when the heat treatment temperature is less than 200° C., a single tetragonal nano crystal is not completely produced, and accordingly, the phosphor fails to exhibit strong light emission. When the temperature is higher than 370° C., there occurs a disadvantage in that aggregation of particles and the like occur due to an overreaction, the size of particles is very large, the size distribution is not uniform, and accordingly, brightness deteriorates. Therefore, it is preferred that the heat treatment temperature is 200 to 370° C. and the heat treatment time is 10 minutes to 4 hours (a nanoparticle forming step). After the heat treatment process was completed, the temperature was cooled to room temperature, and then a nanophosphor having a diameter of 2 to 60 nm in a colloidal state was obtained. The nanophosphor thus prepared was washed with acetone or ethanol, and then was stored while being dispersed in a non-polar solvent such as hexane, toluene, and chloroform.

Figure 4:
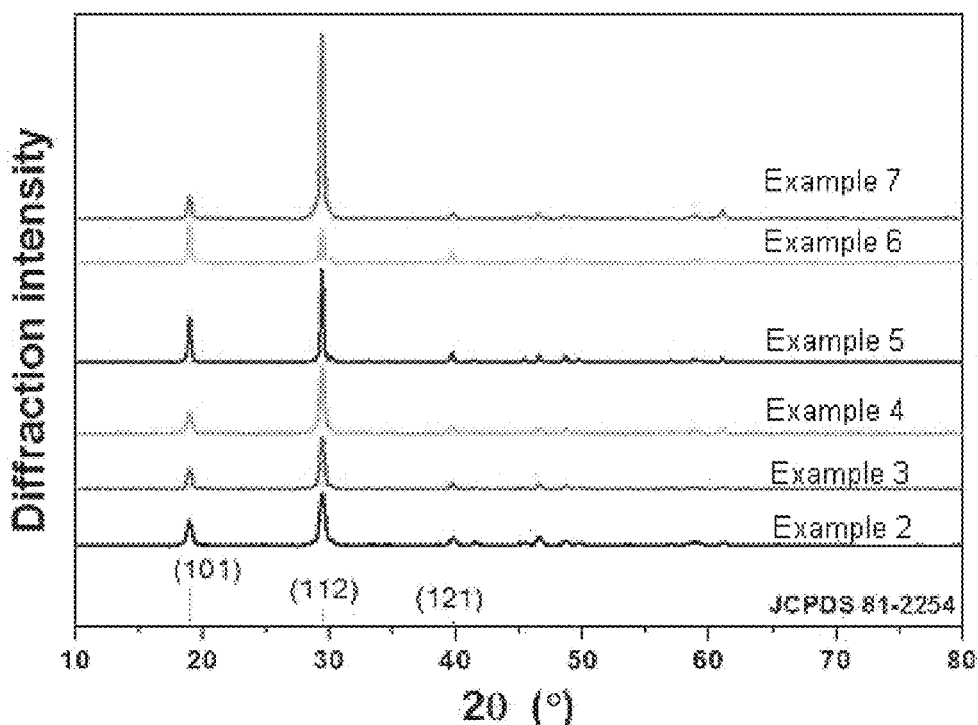

FIG. 4 illustrates an X-ray diffraction pattern of each of the nanophosphors synthesized in Examples 2 to 7 according to the present invention. It can be seen that a single tetragonal phase without impurities was formed regardless of a doping amount of terbium or europium. Further, it can be seen that when compared to a reference X-ray diffraction pattern, the full width at half maximum of the diffraction peak was widened, and it can be additionally confirmed through this that a very small nanoparticle was formed.

Figure 5:
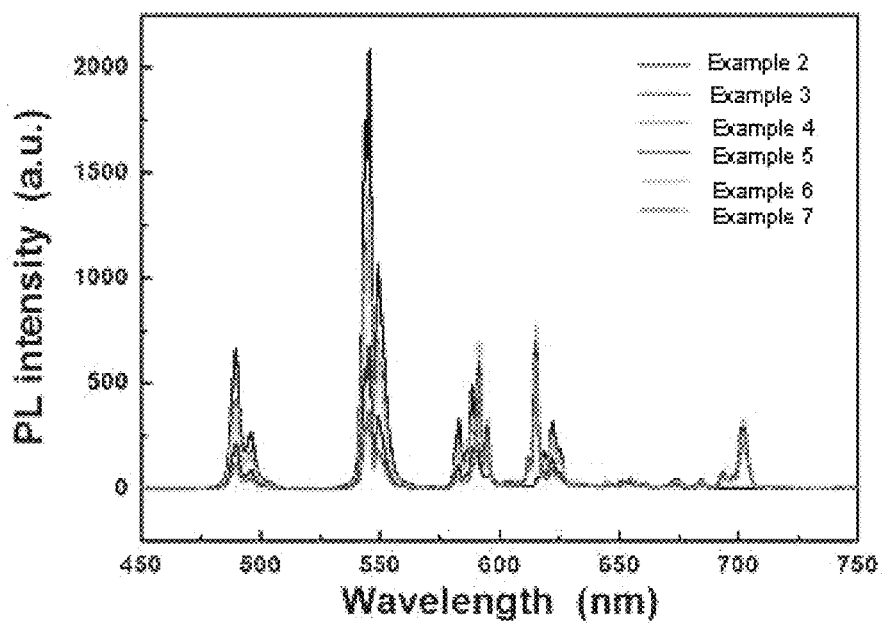

FIG. 5 illustrates PL light emission spectrum of each of the nanophosphors synthesized in Examples 2 to 7 according to the present invention. As the amount of terbium and europium in the host material varies, the relative intensities of light emission spectra in a green spectral region and a red spectral region are changed, and as a result, the luminescence color-emitted from the nanophosphor may be tuned.

Figure 6:
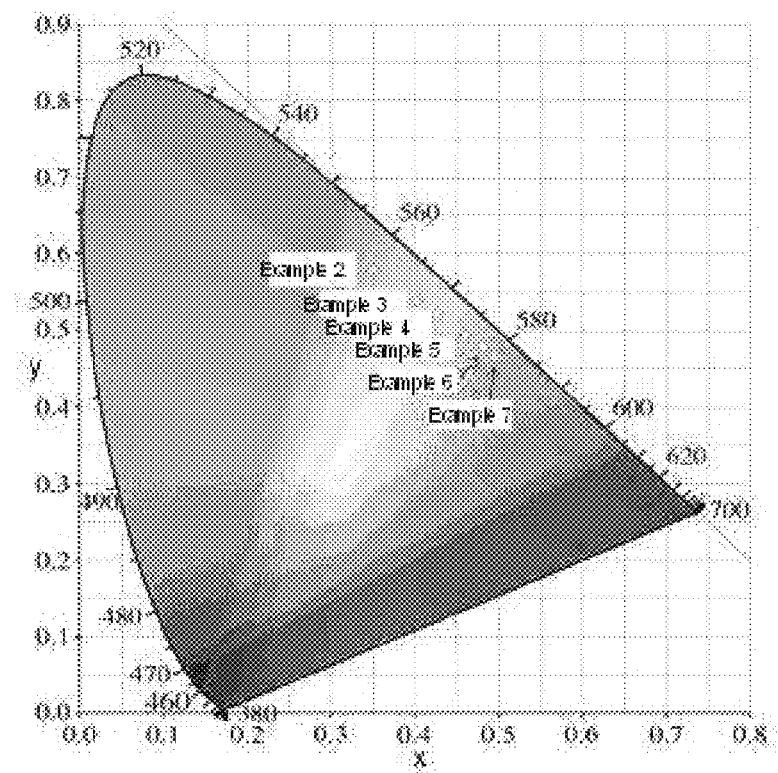

FIG. 6 illustrates a CIE color coordinates of the nanophosphors synthesized in Examples 2 to 7 according to the present invention. As illustrated in FIG. 5, as the amount of terbium and europium in the host material varies, the relative intensities of light emission spectra in the green region and the red region are changed, and as a result, referring to FIG. 6, it can be confirmed that the luminescence color-emitted from the nanophosphor may be tuned.

Figure 7:
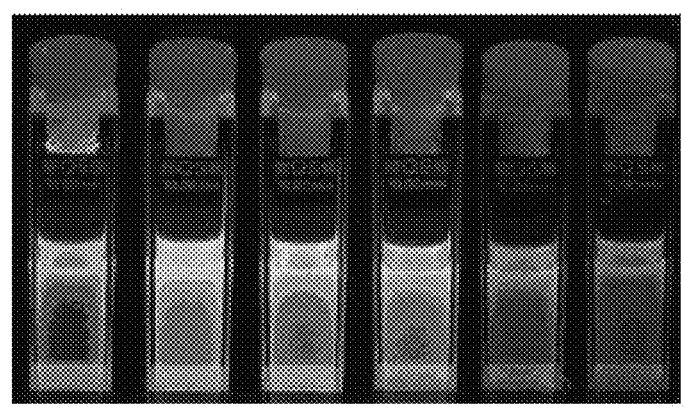

FIG. 7 is a light emission photograph of the nanophosphors synthesized in Examples 2 to 7 according to the present invention. Referring to FIGS. 6 and 7, it can be confirmed that the nanophosphor according to the present invention may emit light with various colors such as green, yellowish green, yellow, and orange color under the ultraviolet light excitation conditions at the same wavelength.

Example 8

Preparation of Fluoride Nanophosphor having Core/Shell Structure

The LiY$_{0.7}$F$_4$:Ce$^{3+}$$_{0.15}$, Tb$^{3+}$$_{0.15}$ nanophosphor obtained through Example 1 was used as a core. In order to form a shell around the core, 1.0 mmol of yttrium chloride hydrate (YCl$_3$.6H$_2$O) was dissolved in 6 ml of oleic acid and 15 ml of 1-octadecene and then LiY$_{0.7}$F$_4$:Ce$^{3+}$$_{0.15}$, Tb$^{3+}$$_{0.15}$ dispersed in 10 ml of chloroform was added thereto. After the mixture was uniformly stirred by using a magnetic stirrer, 10 ml of a methanol solution including 2.5 mmol of lithium hydroxide and 4 mmol of ammonium fluoride was injected into the mixture, and heat treatment was performed as described above in Example 1. After the heat treatment process, the mixture was washed with ethanol, and then was stored while being dispersed in chloroform.

Figure 8:
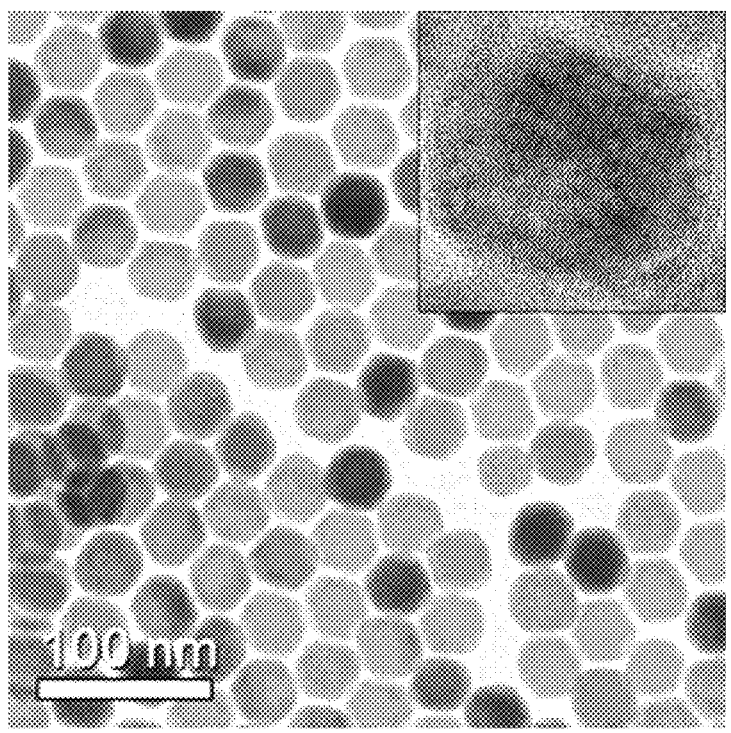

FIG. 8 is a transmission electron microscopy image of a LiY$_{0.7}$F$_4$:Ce$^{3+}$$_{0.15}$, Tb$^{3+}$$_{0.15}$/LiYF$_4$ core/shell nanophosphor synthesized in Example 8 of the present invention. The size of the nanophosphor having a core/shell structure synthesized in Example 8 was 40.0 nm, and it can be confirmed that as the shell was formed around the core, the size was increased. From the high-resolution transmission electron microscopy image of the core/shell nanoparticle, it can be confirmed that a clear lattice pattern was formed, and that the shell was epitaxially formed around the core nanoparticle from the continuous lattice pattern.

Figure 9:
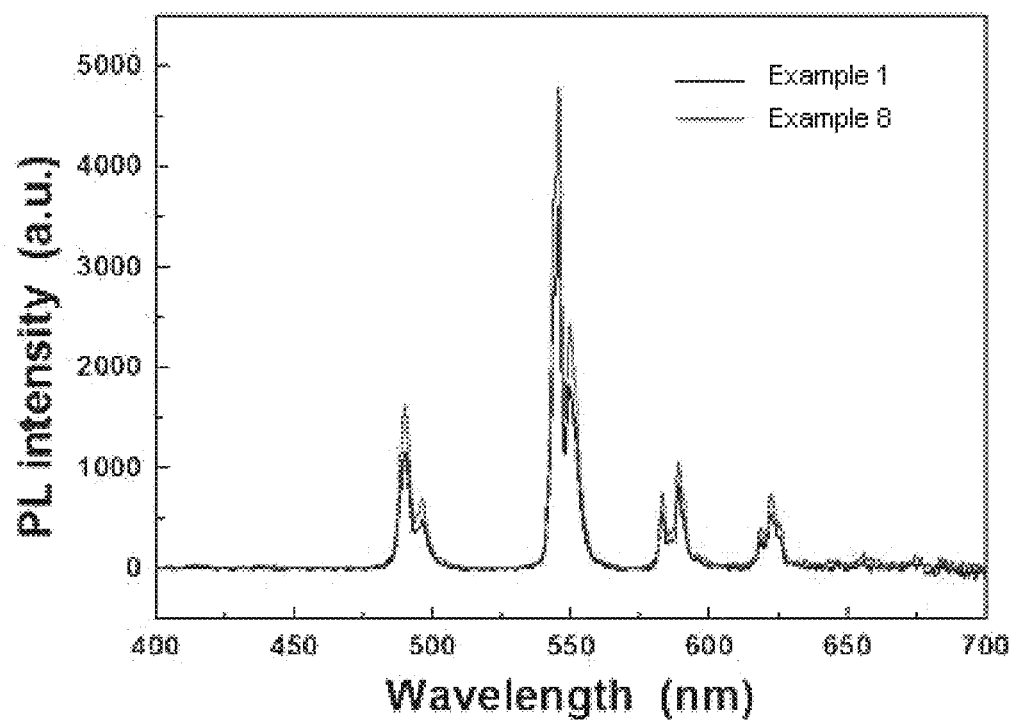

FIG. 9 illustrates light emission spectra of a core nanophosphor and a core/shell nanophosphor, which were synthesized in Example 8 of the present invention. It can be confirmed that as an epitaxial shell was formed around the core, light emission of the nanophosphor was significantly increased, and the light emission intensity was increased by about 33%.

Example 9

Preparation of LiY$_4$:Ce$_{0.13}$, Tb$_{0.14}$ Nanophosphor and PDMS Polymer Composite 0.4 ml of the LiYF$_4$:Ce$_{0.13}$, Tb$_{0.14}$ nanophosphor obtained through Example 2 was mixed with 10 ml of a polydimethylsiloxane (PDMS) polymer and 1 ml of a curing agent. A nanophosphor-polymer composite could be obtained by maintaining a nanophosphor polymer mixture having a core/shell structure at 80° C. for 1 hour, and then cooling the mixture to room temperature.

Figure 10:
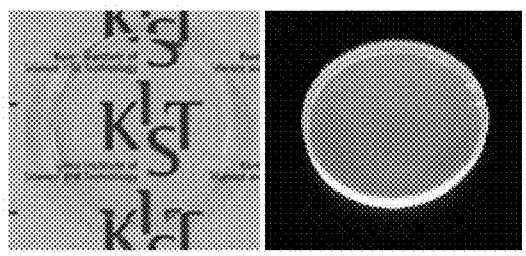

FIG. 10 is a photograph of a nanophosphor-polymer composite prepared in Example 9 of the present invention.

As illustrated in FIG. 10, the polymer composite in which the nanophosphor was dispersed was so transparent that letters on a document placed under the polymer composite could be clearly confirmed. Furthermore, when the nanophosphor was excited by an ultraviolet light lamp at 306 nm, it could be confirmed that light with green color was emitted, and through this, it could be confirmed that a nanophosphor-polymer composite having high transparency and excellent light emission characteristics was prepared.

Example 10

Preparation of LiYF$_4$:Ce$_{0.13}$, Tb$_{0.14}$Eu$_{0.02}$ Nanophosphor and PDMS Polymer Composite 0.4 ml of the LiYF$_4$:Ce$_{0.13}$, Tb$_{0.14}$Eu$_{0.02}$ nanophosphor obtained through Example 4 was mixed with 10 ml of a polydimethylsiloxane (PDMS) polymer and 1 ml of a curing agent. A nanophosphor-polymer composite could be obtained by maintaining a nanophosphor polymer mixture having a core/shell structure at 80° C. for 1 hour, and then cooling the mixture to room temperature.

Figure 11:
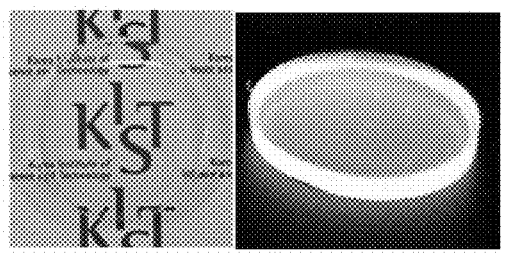

FIG. 11 is a photograph of a nanophosphor-polymer composite prepared in Example 10 of the present invention. As illustrated in FIG. 11, the polymer composite in which the nanophosphor was dispersed was so transparent that letters on a document placed under the polymer composite could be clearly confirmed. Furthermore, when the nanophosphor was excited by an ultraviolet light lamp at 306 nm, it could be confirmed that light with yellowish green color was emitted, and through this, it could be confirmed that a nanophosphor-polymer composite having high transparency and excellent light emission characteristics was prepared.

As described above, although the present invention has been described with reference to preferred exemplary embodiments of the present invention, it can be understood by a person with ordinary skill in the art that various changes and modifications may be made without departing from the spirit and scope of the present invention as described in the following claims.

The person with ordinary skill in the art may improve and modify the technical spirit of the present invention in various forms. Accordingly, the improvements and modifications will fall within the scope of the present invention as long as they are obvious to the person with ordinary skill in the art. The foregoing embodiments and advantages are merely exemplary and are not to be considered as limiting the present invention. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A fluoride-based LiYF$_4$ nanophosphor co-doped with Ce$^{3+}$ and Tb$^{3+}$, which is represented by the following Formula 1:

$$\text{LiY}_{1-x-y}\text{F}_4\text{:Ce}^{3+}{}_x\text{,Tb}^{3+}{}_y \qquad \text{[Formula 1]}$$

(x is a real number in the range of 0.01≤x≤0.2, and y is a real number in the range of 0.01≤y≤0.3).

2. A fluoride-based multicolor light emission LiYF$_4$ nanophosphor co-doped with Ce$^{3+}$, Tb$^{3+}$ and Eu$^{3+}$ which is represented by the following Formula 2:

$$\text{LiY}_{1-x-y-z}\text{F}_4\text{:Ce}^{3+}{}_x\text{,Tb}^{3+}{}_y\text{, Eu}^{3+}{}_z \qquad \text{[Formula 2]}$$

(x is a real number in the range of 0.1≤x≤0.15, y is a real number in the range of 0<y≤0.2, and z is a real number in the range 0<z≤0.1).

3. A fluoride-based nanophosphor having a core/shell structure, wherein the core is represented by the following Formula 1 or 2, and the shell is represented by the following Formula 3:

$$\text{LiY}_{1-x-y}\text{F}_4\text{:Ce}^{3+}{}_x\text{,Tb}^{3+}{}_y \qquad \text{[Formula 1]}$$

(x is a real number in the range of 0.01≤x≤0.2, and y is a real number in the range of 0.01≤y≤0.3)

$$\text{LiY}_{1-x-y-z}\text{F}_4\text{:Ce}^{3+}{}_x\text{,Tb}^{3+}{}_y\text{, Eu}^{3+}{}_z \qquad \text{[Formula 2]}$$

(x is a real number in the range of 0.1≤x≤0.15, y is a real number in the range of 0≤y≤0.2, and z is a real number in the range of 0≤z≤0.1).

$$\text{LiY}_{1-r}M_r\text{F}_4 \qquad \text{[Formula 3]}$$

(r is a real number in the range of 0≤r<1, and M is a lanthanide element selected from the group consisting of La, Pr, Nd, Pm, Sm, Er, Gd, Dy, Ho, Tm, Lu and a combination thereof).

4. The nanophosphor of claim 1 wherein the nanophosphor represented by Formula 1 has a diameter of 2 to 60 nm.

5. The nanophosphor of claim 1 wherein the nanophosphor has a tetragonal structure.

6. The nanophosphor of claim 3, wherein the nanophosphor having a core/shell structure has a diameter of 2 nm to 70 nm.

7. The nanophosphor of claim 2, wherein the nanophosphor shows multicolor light emission characteristic of green, yellowish green, yellow and orange colors.

8. The nanophosphor of claim 1, wherein the nanophosphor absorbs ultraviolet light of a single wavelength to show light emission characteristic.

9. A polymer composite comprising the nanophosphor of claim 1.

10. A solar cell comprising the nanophosphor of claim 1 as a wavelength conversion layer.

11. A forgery prevention code comprising the nanophosphor of claim 1 as a wavelength conversion layer.

* * * * *